United States Patent [19]
Schürmann

[11] 3,988,681
[45] Oct. 26, 1976

[54] AUTOMATIC TUNING SYSTEM
[75] Inventor: Joe H. Schürmann, Oberhummel, Germany
[73] Assignee: Texas Instruments Incorporated, Dallas, Tex.
[22] Filed: Aug. 4, 1975
[21] Appl. No.: 601,784

[30] Foreign Application Priority Data
Aug. 7, 1974 Germany............................ 2437974

[52] U.S. Cl................................ 325/470; 325/464
[51] Int. Cl.².......................................... H04B 1/32
[58] Field of Search........... 325/470, 422, 464, 459, 325/471, 465

[56] References Cited
UNITED STATES PATENTS

| | | | |
|---|---|---|---|
| 2,825,804 | 3/1958 | Rug............................. | 325/470 X |
| 3,671,870 | 6/1972 | Wellhausen......................... | 325/470 |
| 3,794,925 | 2/1974 | Imazeki............................. | 325/470 |
| 3,919,646 | 11/1975 | Morgan............................. | 325/470 |
| 3,931,579 | 1/1976 | Ma et al............................. | 325/464 |

Primary Examiner—Robert L. Richardson
Attorney, Agent, or Firm—Harold Levine; James T. Comfort; Richard L. Donaldson

[57] ABSTRACT

The tuning circuit of a heterodyne oscillator is controlled by a sweep device to sweep the oscillator frequency over a range in which predetermined frequency values are associated with predetermined broadcast receiver channels. The oscillator signal is applied to a multiresonance filter which generates an output signal when the oscillator frequency corresponds with a broadcast channel frequency. The output signal frequency is counted by a counter and compared with a number stored in an input device which identifies a particular broadcast channel to be selected. The comparator produces a signal which indicates the coincidence or noncoincidence of the compared quantities. When the comparator generates a signal indicating a noncoincidence condition, it operates the sweep device; when the comparator output corresponds to a coincidence condition, operation of the sweep device is discontinued. Operation of the sweep device is initiated by application of a search signal thereto.

13 Claims, 1 Drawing Figure

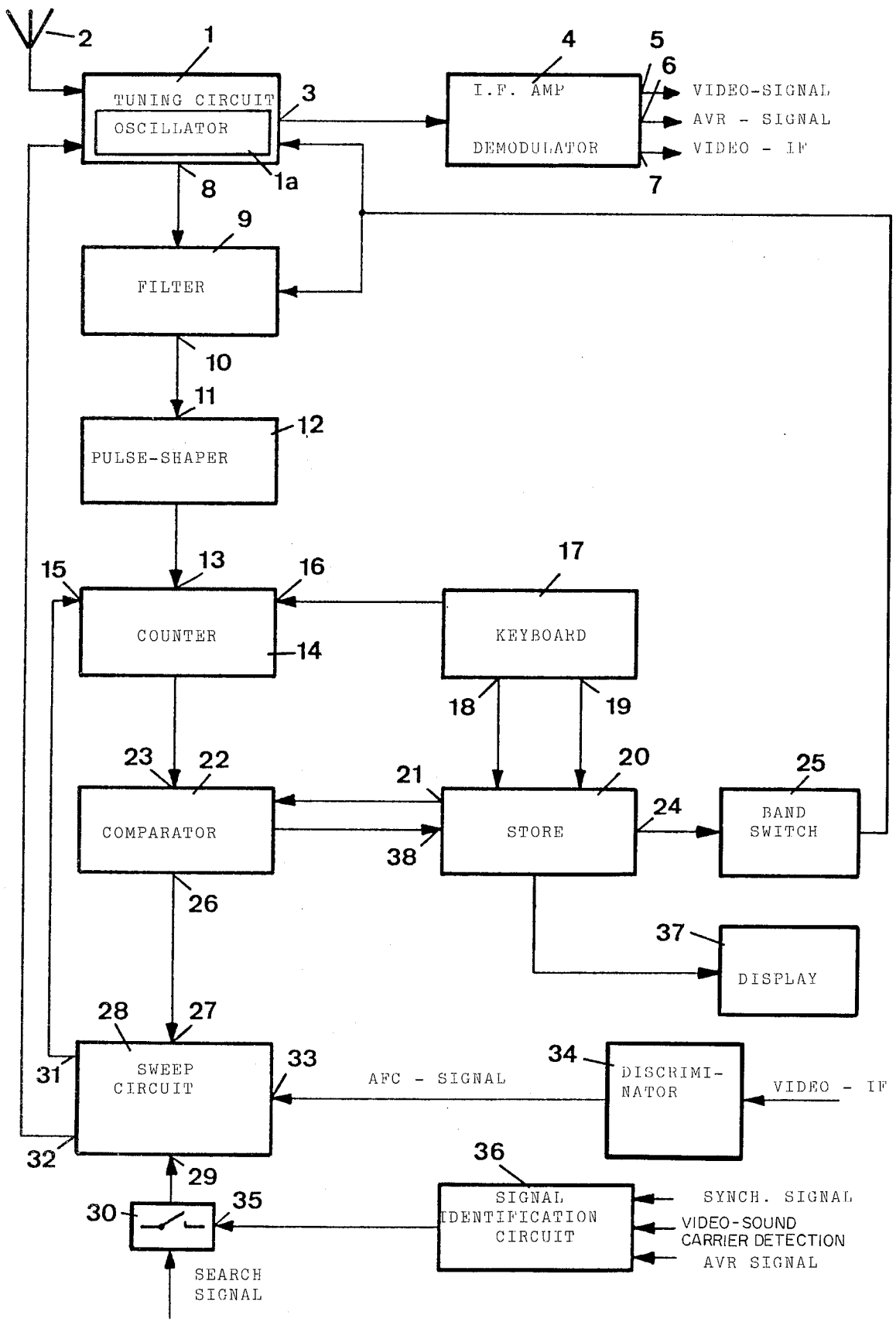

AUTOMATIC TUNING SYSTEM

The invention relates to a channel search and selection system comprising a heterodyne oscillator the frequency of which may be swept over a range in which predetermined frequency values are associated with predetermined receiver channels.

In the present channel search and selection systems or tuner systems, mechanically operated components are employed to select certain channels. For example, potentiometer arrangements are in use which comprise pushbuttons and in which on depression of a predetermined pushbutton a signal is generated which results in tuning to a predetermined receiver channel. For setting to a predetermined receiver channel, the potentiometers coupled to the pushbuttons may be adjusted. After the intitial setting of these potentiometers, the established setting is re-obtained each time the corresponding pushbutton is depressed.

According to the invention, a channel search and selection system includes a multiresonance filter arrangement which receives as input signal the output signal of a swept frequency oscillator and on reaching an input signal frequency value corresponding to a receiver channel generates an output signal. A counter counts the output signals of the multiresonance filter arrangement. An input device is operable to introduce and store a number associated with a receiver channel and a comparator circuit is connected to the counter and the input device for comparing the count with the number stored in the input device. The comparator produces a signal which indicates the coincidence or noncoincidence of the compared quantities. A sweep control device varies the frequency of the oscillator and is initiated by the signal from the comparator circuit when it indicates the noncoincidence of the compared quantities and is disabled when it indicates the coincidence of the compared quantities.

In a channel search and selection system according to the invention, the multiresonance filter arrangement emits an output signal whenever its input signal has a frequency value associated with a receiver channel. The output signal of the multiresonance filter arrangement is then counted in a counter so that the respective count is directly related to the receiver frequency. That count may then be compared in a comparator circuit with a number which is contained in an input device and which is associated with a receiver channel. The comparator circuit then establishes the identity or non-identity of the compared quantities and with the aid of a signal produced thereby controls a sweep device for varying the frequency of the heterodyne oscillator. The sweep operation proceeds until the signal from the comparator circuit indicates the identity of the quantities compared. Since when the sweep device is disabled the number contained in the input device and associated with a receiver channel coincides with the count, the heterodyne oscillator at the instant of the disablement is tuned exactly to the receiver channel whose number is stored in the input device. In this manner a desired channel has thus been selected.

With a system according to the invention, the channel search and selection operation may be made completely automatic.

In a preferred embodiment of the invention, the sweep device is actuable in dependence upon the presence of a search signal and may be disabled automatically in dependence upon the presence of a signal indicating reception of a transmitter. With this embodiment the sweeping of the heterodyne oscillator may be initiated by applying a search signal and the sweep operation continued until a transmitter broadcast signal is received.

So that the heterodyne oscillator is set only to transmitters which can be received with sufficient quality, an advantageous embodiment of the invention provides a signal identification circuit which in dependence upon an analysis of signals generated when a transmitter is received, reactuates the sweep device after a disablement when the received signal does not meet predetermined signal criteria, e.g., signal strength.

In a preferred embodiment of the invention, the sweep circuit is a controllable current source which in the actuated state applies a linearly rising sweep signal to a voltage-variable capacitor which is contained in the heterodyne oscillator and determines the frequency of its output signal. This further development of the invention contributes to the possiblity of conducting the sweep of the heterodyne oscillator purely electrically without using mechanical components.

The invention will now be explained by way of example and in greater detail with reference to the drawing, the single FIGURE of which shows a block circuit diagram of an embodiment of a channel search and selection system according to the invention. Further advantages of the invention will become clear from the description.

In the following description, the channel search and selection system is described as applied to a television receiver but other uses are readily possible in which other frequency ranges occur.

The channel search and selected system illustrated in the drawing comprises a tuning circuit 1 which contains a heterodyne oscillator 1a and to which is applied a high-frequency signal received via an antenna 2. The intermediate frequency signal emitted at the output 3 of the tuning circuit 1 is supplied to an IF amplifier and demodulator circuit 4 which emits at three outputs 5, 6 and 7, the video signal, the AGC signal related to the level of the high-frequency signal received and used for automatic gain control and the sound IF signal.

The output signal of the heterodyne oscillator contained in the tuning circuit 1 is emitted at the output 8 and supplied to a filter arrangement 9. Said filter arrangement 9 is a surface-wave filter in which electrical input signals are converted to an acoustic surface wave passing through the filter and then being reconverted to electrical signals. Such a filter emits an output signal whenever the input signal supplied thereto has a predetermined frequency. It is of course possible to use for this filter arrangement 9 any arrangement which has the property of emitting an output signal at a predetermined input signal frequency.

The output 10 of the filter arrangement 9 is connected to the input 11 of a pulse shaper 12 which reshapes the output signals of the filter arrangement to exact rectangular pulses.

The rectangular pulses from the shaper 12 are fed to the input 13 of a counter 14 which counts said output pulses. The counter has two reset inputs 15 and 16 via which it can be set to a predetermined initial count by applying a reset signal.

The channel search and selection system illustrated in the drawing comprises a keyboard 17 with the aid of which a datum characterizing the frequency to be received can be fed into a store 20 connected to the keyboard outputs 18 and 19 or store locations containing such a datum can be addressed.

The content of addressed store locations can be supplied via an output 21 to a comparator circuit 22 in which it may be compared with a count applied to an input 23. Furthermore, the content of an addressed store location can be supplied via an output 24 also to a band switch 25 which effects in the tuning circuit 1 a switching to a desired frequency band and that the filter arrangement 9 is also switched for processing the desired frequency band.

The comparator circuit 22 can emit at the output 26 a signal which indicates the coincidence or noncoincidence between the count and the content of the addressed store location. Said signal at the output 26 in the comparator circuit is fed to the input 27 of a sweep circuit 28 which under conditions explained in further detail hereinafter sweeps the frequency range of the heterodyne oscillator of the tuning circuit 1.

The sweep circuit 28 is so constructed that it sweeps the frequency of the heterodyne oscillator 1a when the signal applied to its input 27 from the comparator circuit 22 indicates the noncoincidence of the magnitudes compared therein or when a search signal applicable via a switch 30 is applied to its input 29. An output 31 of the sweep circuit 28 is connected to the reset input 15 of the counter; via said output 31 a reset signal is applied to the counter whenever the sweep device begins to sweep the frequency range of the heterodyne oscillator 1a of the tuning circuit 1. The signal effecting the sweeping of the oscillator 1a is emitted at the output 32 of the sweep devide 28. The latter may conduct a channel fine tuning by an AFC signal at the input 33 taken from a discriminator 34 controlled by the video IF signal.

The switch 30 via which the search signal may be fed to the input 29 of the sweep device 28 may be controlled with the aid of a signal at an input 35 which is recovered in a signal identification circuit 36. In this identification circuit, it is established by investigating a synchronizing signal obtained from the pulse clipping stage of a television receiver, a sound carrier signal and the AGC signal whether the station signal being received by the antenna 2 does in fact originate from a picture transmitter and is received with the necessary level. A display 37 is also connected to the store 21 with which a datum characterizing the received station, for example the channel number, may be indicated when identify of the compared quantities is reached.

When the television receiver equipped with the channel search and selection system described herein is first operated, a setting operation must be carried out so that on subsequent depression of a predetermined program button a predetermined station is received. The setting operation may be carried out completely automatically, including the registering of all channels giving acceptable receipion by their channel number in the store.

During this setting operation, the channel search and selection system functions as follows:

A number is fed in at the keyboard 17 and addresses a predetermined location in the store 20. Information is also fed in which determines the frequency band in which the setting operation is to be carried out. This information relating to the frequency band initiates in the tuning circuit 1 and the filter arrangement 9 a switching to the desired frequency band. When the number keyed in is the channel number of a station to be sought, the circuit arrangement may be made such that the associated frequency band is recognized from the channel number itself and the changing to said frequency band is automatic without having to feed-in special band information.

Now that a predetermined location in the store 20 is addressed and is ready to receive data, a search signal is applied to the sweep device 28 via the switch 30. The sweep device 28 contains a current source which delivers current to charge a capacitor contained in the sweep circuit as long as the search signal is applied to its input 29. The DC voltage forming at this capacitor and at the output 32 of the sweep device 28 passes to the heterodyne oscillator 1a of the tuning circuit 1 and effects the sweeping of the frequency range of said oscillator 1a.

The output signal of the oscillator 1a contained in the tuning circuit 1 is emitted at the output 8 and supplied to the filter arrangement 9 which emits an output signal at the output 10 whenever its input signal has a predetermined frequency. The output signals of the filter arrangement 9 are converted in a shaper 12 to rectangular pulses which are then counted in a counter 14. The count produced in the counter 14 is thus always exactly related to the particular output frequency of the oscillator 1a of the tuning circuit 1. By correspondingly presetting the count prior to supplying the first stepping pulse from the shaper 12, the count can be made to correspond exactly to the number of the transmitter channel which is received with the then existing tuning of the heterodyne oscillator.

The count of the counter 14 passes via the comparator circuit 22 and the line 38 directly to the location in the store 20 addressed by the keyboard 17.

It will now be assumed that during the tuning of the heterodyne oscillator 1a to a predetermined channel a station is received. The IF amplifier and the modulator circuit 4 fed by the IF signal from the tuning circuit 1 then generates in the usual manner the video signal, the AGC signal used for automatic gain control and the sound IF signal. The video IF signal is supplied to the discriminator 34 which applies a blocking signal to the input 33 of the sweep device 28 when the tuning circuit 1 is tuned exactly to the channel center of the station received. The blocking signal at the input 33 of the sweep circuit 28 causes the sweep signal supplied to the tuning circuit 1 from the output 32 to remain constant so that the oscillator in the tuning circuit 1 remains tuned to the frequency reached.

Since it may happen that the station received does not have adequate strength to produce satisfactory pictures or the transmitter is not a television transmitter and consequently does not transmit a video-sound signal, the signal identification circuit 36 investigates the synchronizing signal coming from the pulse clipping stage of the television receiver, the 5.5 Mc/s intercarrier sound signal derived from the video detector and the AGC signal. It may be clearly determined from the investigation of the signals whether a picture transmitter is involved and whether it is received with the necessary strength. If the station received does not meet the requirements made, the signal identification circuit 36 passes to the input 35 of the switch 30 a signal which causes the sweep device 28 to a recommence emission of the output 32 of a sweep signal for the heterodyne oscillator in the tuning circuit 1.

The brief stopping of the sweep device 28 with the aid of the signal originating from the discriminator 34 is necessary because the analysis carried out in the signal identification circuit 36 takes a certain amount of time.

When a station is received which meets all the requirements, the sweep device 28 remains arrested because the signal identification circuit 37 does not reactuate in this case. The count fed via the comparator circuit 22 into the addressed location of the store 20 exactly characterizes the channel of the transistor received. The first station received with sufficient quality in the selected frequency band or that defined by the channel number is now in the store.

After storing the count reached, a stepping pulse may be applied via the switch 30 to the switch device 28 to continue the search. If the restarted search is to be made in the same frequency band as the preceding search operation, the heterodyne oscillator is swept starting with the frequency previously reached. If the frequency band is changed, the sweep signal emitted at the output 32 of the sweep circuit 28 is set to zero and the counter 14 is also set via the input 15 to the starting value provided in this frequency range.

In the manner outlined the tuning circuit 1 may be swept over the various frequency bands and when a station is received which meets all the requirements, the respective count will be fed to the location in the store 20 addressed via the keyboard 17. Thus, on completion of the tuning operation numbers are stored in the store 20 which are clearly related to the frequency of the stations received.

To select a certain station with the aid of the channel search and selection system the number which was previously the store address used when finding this station must be keyed in. When this location is addressed, the location content passes to the comparator circuit 32, the information relating to the frequency band passes to the band switch 25 and effects the setting of the tuning circuit 1 and the filter arrangement 9 to the frequency band in which the desired station lies.

The comparator circuit 22 then compares the count of the counter 14 with the content of the addressed store location. Since the count and the store content at the beginning of the selection operation will certainly be different, the comparator circuit produces at its output 26 a signal indicating the nonidentity of the quantities compared. This signal passes to the input 27 of the sweep device 28 and as a result the latter produces at its output 32 a sweep signal which is fed to the heterodyne oscillator in the tuning circuit 1. The output signal of the oscillator passes to the filter arrangement 9 which on reaching a predetermined frequency value in turn produces an output signal which passes via the shaper 12 to the counter 14. With each output signal of the filter arrangement 9, the count of the counter is increased until it finally coincides with the content of the addressed location. At this instant the comparator circuit sends a signal indicating identity of the compared quantities to the sweep device 28 and the latter terminates the sweeping of the oscillator. The oscillator of the tuning circuit 1 is now so tuned that the desired station is received.

If a circuit is used for the discrimiator 34 whose output signal in the case of exact tuning of the oscillator in the circuit 1 to the desired station passes through zero, the output signal of the discriminator 34 may also be utilized as fine-tuning signal in that it controls the sweep device in such a manner that the sweep signal at the output 32 sets the oscillator precisely to the desired station.

To select further stations, all that is necessary is to key the numbers used in the aforementioned setting operation for addressing store locations into the key means 17. The tuning operation of the oscillator in the circuit 1 then proceeds completely automatically.

As is apparent from the above remarks the circuit arrangement described does not require any mechanical components. It can thus be made solely from electrical components in the form of an integrated circuit. It is therefore very reliable and has a long life.

The actual design of the above described channel search and selection system may be used as a tuning circuit of a tuner as described in "Funkschau" No. 18, 1970, p. 60. A suitable IFM demodulator circuit is described in "Funkschau" No. 22, 1973, pp. 849 – 852.

The output signal of the filter 9 is shaped by a pulse shaper 12 which can be a common Schmitt-Trigger circuit. The counter 14 can be an integrated circuit type SN 7490 marketed by Texas Instruments Incorporated. The equivalent circuit can also be constructed from two integrated circuits SN 7400 and from an integrated circuit SN 7420, also marketed by Texas Instruments Incorporated.

A suitable device for the memory 20 is an integrated circuit type TMS4033 marketed by Texas Instruments Incorporated. Since this memory loses information when the supply voltage is cut off, the memory must have a d.c. supply when the TV receiver is switched off, so that the integrity of the information in the memory can be maintained. In "Funkschau" No. 13, 1973, pp. 469 – 472, there is described a circuit arrangement which may be used for the sweep circuit 28, the band switch 25 and the discriminator 24.

A circuit suitable for use as the signal identification circuit 36 is disclosed by U.S. application Ser. No. 579,653 filed May 21, 1975. A signal identification circuit is described in that patent application which examines a received signal, determining if the signal is radiated from a video transmitter and if the signal has a sufficient transmission level.

The memory 20 may be realized by a 7-segment decoder SN7446 marketed by Texas Instruments Incorporated, suitably encoded in accordance with the devised channel numbers.

What we claim is:

1. A broadcast receiver channel search and selection system comprising heterodyne oscillator means for generating a signal the frequency of which may be swept over a range in which predetermined frequency values are associated with predetermined receiver channels, multiresonance filter means for receiving as input signal the signal from the heterodyne oscillator and adapted in response to an input signal frequency value corresponding to a receiver channel generate an output signal, counter means for counting output signals from the multiresonance filter means, an input device for introducing and storing a number associated with selected receiver channel, a comparator circuit connected to said counter and said input device for comparing the count with the number stored in the input device and for producing signals indicating the the coincidence or noncoincidence of said count and said stored number, and a sweep device operable to vary the frequency of said heterodyne oscillator responsive to a noncoincidence indicating signal from the comparator circuit, and operable to discontinue variation of the frequency of said heterodyne oscillator in response to a coincidence indicating signal from said comparator circuit.

2. A system according to claim 1, wherein said multiresonance filter means is a filter means comprising a pass band for each frequency associated with said receiver channel.

3. A system according to claim 2, wherein said filter means is a surface-wave filter.

4. A system according to claim 1, including means for generating a search signal for initiating actuation of said sweep device to vary the frequency of said heterodyne oscillator means.

5. A system according to claim 4, including channel signal identification circuit means for comparing a received channel signal with predetermined signal criteria and responsive to identification of an unacceptable received channel signal, to reactuate, said device to continue varying the frequency of said heterodyne oscillator.

6. A system according to claim 4, wherein said input device is adapted to store said counts reached whenever said sweep device is operated to discontinue variation of the frequency of said heterodyne oscillator.

7. A system according to claim 1, wherein said input device includes a store and keyboard means operable to enter into said store said numbers associated with said selected receiver channels.

8. A system according to claim 7, including means for entering into said store information determining the frequency band containing said receiver channels.

9. A system according to claim 1, wherein said heterodyne oscillator includes voltage-variable capacitor means for determining the frequency of said oscillator signal, and wherein said sweep device is a controllable current source adapted in an actuated state to apply a linearly rising sweep signal voltage to said voltage-variable capacitor.

10. In a broadcast receiver, a search and selection system comprising swept frequency oscillator means for generating a signal, the frequency of which can be swept over at least one range in which predetermined frequency values are associated with predetermined receiver channels for receiving broadcast signals; multiresonance filter means including an individual pass band for each of said predetermined frequency values, said filter means connected to receive said oscillator signal and adapted in response to an oscillator signal frequency value within any of said pass bands to generate an output signal; frequency sweep control means operable to vary the frequency of said swept frequency oscillator means; counter circuit means for counting output signals from said filter means; input circuit means including store means and means for selectively entering into said store, numbers corresponding with respective selected receiver channels; means operable to generate a search signal for initiating operation of said sweep device; comparator circuit means connected to said counter and said input circuit means for comparing the count of said counter with a said number stored by said store means and for producing a first signal indicating coincidence of said count and said stored number, and a second signal indicating noncoincidence of said count and said stored number; said comparator circuit means connected to apply said first signal to operate said sweep control means and to apply said second signal to discontinue operation of said sweep control means; and channel signal identification circuit means for comparing a received channel signal with predetermined signal criteria including at least signal amplitude and responsive to identification of an unacceptable received channel signal based on said criteria, to actuate said sweep control means to continue to vary the frequency of said oscillator means.

11. A channel search and selection system according to claim 10, wherein said input circuit means is adapted to store said counts reached by said counter circuit means whenever said sweep device is operated to discontinue variation of the frequency of said oscillator means.

12. A channel search and selection system according to claim 10, wherein said oscillator means includes voltage-variable capacitor means for determining the frequency of said oscillator signal, and wherein said sweep control means includes a controllable current source for applying, when said sweep control means is operated, a linearly rising sweep signal voltage to said voltage-variable capacitor.

13. A channel search and selection system according to claim 12, wherein said multiresonance filter means comprises a surface-wave filter means.

* * * * *